(12) United States Patent
Verschuuren

(10) Patent No.: US 10,538,017 B2
(45) Date of Patent: Jan. 21, 2020

(54) TRANSFER METHOD AND APPARATUS AND COMPUTER PROGRAM PRODUCT

(71) Applicant: KONINKLIJKE PHILIPS N.V., Eindhoven (NL)

(72) Inventor: Marcus Antonius Verschuuren, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 290 days.

(21) Appl. No.: 15/511,394

(22) PCT Filed: Sep. 9, 2015

(86) PCT No.: PCT/EP2015/070527
§ 371 (c)(1),
(2) Date: Mar. 15, 2017

(87) PCT Pub. No.: WO2016/045961
PCT Pub. Date: Mar. 31, 2016

(65) Prior Publication Data
US 2017/0239850 A1    Aug. 24, 2017

(30) Foreign Application Priority Data
Sep. 22, 2014 (EP) .................................. 14185700

(51) Int. Cl.
*B29C 37/00* (2006.01)
*G03F 7/00* (2006.01)
(Continued)

(52) U.S. Cl.
CPC ............... *B29C 37/00* (2013.01); *B05D 1/28* (2013.01); *B29C 59/02* (2013.01); *G03F 7/00* (2013.01);
(Continued)

(58) Field of Classification Search
CPC ........ G03F 7/00; G03F 7/0002; G03F 7/0037; G03F 7/16; G03F 7/161; G03F 9/00;
(Continued)

(56) References Cited

U.S. PATENT DOCUMENTS 5,669,303 A    9/1997 Maracas
7,592,108 B2   9/2009 Yamaguchi et al.
(Continued)

FOREIGN PATENT DOCUMENTS

WO    WO2005101466 A2    10/2005
WO    WO2008068701 A2    6/2008
(Continued)

OTHER PUBLICATIONS

Ji R. et al., "UV Enhanced Substrate Conformai Imprint Lithography (UV-SCIL) Technique for Photonic Crystals Patterning in LED Manufacturing", Microelectronic Engineering, Elsevier Publishers BV., Amsterdam, NL, vol. 87, No. 5-8, Nov. 29, 2009 (Nov. 29, 2009), pp. 963-967, XP026945350.
(Continued)

Primary Examiner — William P Fletcher, III

(57) ABSTRACT

A method of transferring a flexible layer to a substrate makes use of a partial bulge in the flexible layer, which does not make contact with the substrate. The partial bulge advances to the location of an alignment marker on the substrate. When alignment adjustments are needed, they are made with the partial bulge in place so that more reproducible positioning is possible when fully advancing the flexible layer against the substrate.

11 Claims, 7 Drawing Sheets

(51) Int. Cl.
   *G03F 9/00*         (2006.01)
   *G03F 7/16*         (2006.01)
   *B05D 1/28*         (2006.01)
   *B29C 59/02*        (2006.01)

(52) U.S. Cl.
   CPC .......... *G03F 7/0002* (2013.01); *G03F 7/0037* (2013.01); *G03F 7/16* (2013.01); *G03F 7/161* (2013.01); *G03F 9/00* (2013.01); *G03F 9/70* (2013.01); *G03F 9/7003* (2013.01); *G03F 9/7019* (2013.01); *G03F 9/7042* (2013.01); *G03F 9/7073* (2013.01); *G03F 9/7076* (2013.01); *G03F 9/7088* (2013.01); *B29C 2037/903* (2013.01); *G03F 2009/005* (2013.01)

(58) Field of Classification Search
   CPC .... G03F 2009/005; G03F 9/70; G03F 9/7003; G03F 9/7019; G03F 9/7042; G03F 9/7073; G03F 9/7076; G03F 9/7088
   See application file for complete search history.

(56) References Cited

U.S. PATENT DOCUMENTS

| | | | |
|---|---|---|---|
| 8,075,298 B2 | 12/2011 | Nielsen | |
| 8,166,876 B2 * | 5/2012 | Schneider | B41K 3/02 101/287 |
| 8,741,199 B2 | 6/2014 | Lan et al. | |
| 9,798,231 B2 * | 10/2017 | Shiode | G03F 7/0002 |
| 2004/0261981 A1 | 12/2004 | McCoy | |
| 2004/0264019 A1 | 12/2004 | Curtiss | |
| 2005/0230882 A1 | 10/2005 | Watts | |
| 2006/0152703 A1 * | 7/2006 | Yamaguchi | G03F 1/22 355/77 |
| 2008/0202365 A1 | 8/2008 | Schneider | |
| 2009/0314414 A1 * | 12/2009 | Verschuuren | B82Y 10/00 156/64 |
| 2012/0299222 A1 * | 11/2012 | Lan | G03F 7/0002 264/447 |
| 2013/0015597 A1 | 1/2013 | Hattori | |

FOREIGN PATENT DOCUMENTS

| | | |
|---|---|---|
| WO | WO2008087573 A2 | 7/2008 |
| WO | WO2009141774 A1 | 11/2009 |

OTHER PUBLICATIONS

Marzolin C. et al., "Fabrication of Glass Microstructures by Micro-Molding of Sol-Gel Precursors", Communications, Advanced Materials, vol. 10(8), 1998, pp. 571-574.

* cited by examiner

TRANSFER METHOD AND APPARATUS AND COMPUTER PROGRAM PRODUCT

FIELD OF THE INVENTION

The invention relates to a method of mechanically contacting a flexible stamp onto a substrate with accurate alignment and to a method using the contacting method for imprinting a substrate by imprinting an imprintable layer on the substrate with an imprinting pattern on a flexible stamp.

The invention further relates to a computer program product for executing the method and to a controller implementing the computer program product.

The invention yet further relates to an apparatus configured to implement the method.

BACKGROUND OF THE INVENTION

Imprint lithography is gaining interest as a viable alternative to more traditional (mask-based) optical lithography techniques as imprint lithography promises to be able to provide smaller feature sizes in a pattern to be transferred onto a substrate such as the substrate of a semiconductor device. In imprint lithography techniques such as substrate conformal imprinting lithography (SCIL), a flexible stamp including a feature pattern on its surface is brought into contact with such a substrate, which substrate typically carries a resist material, which resist material is imprinted by the feature pattern. The resist material is subsequently developed, e.g. cured, after which the feature pattern is released from the resist material to leave a patterned resist layer on the substrate.

An important aspect in this type of technology has been to achieve nanometer accuracy overlay alignment on wafer scale areas, to allow a so-called "nanoimprint" technology to be enabled for multilayer device manufacture. This would allow the technique to be used for multi-layer device fabrication.

Previous methods have used small area rigid or hard stamps which then need to be aligned and imprinted many times to populate a whole wafer. Alternatively, a single rigid wafer scale stamp is used to avoid distortions in the stamp, but this requires high pressures and forces to be applied to the stamp and substrate in order to make conformal contact. Furthermore, the stamp and the substrate need to be aligned with the final precision before contact is made, avoiding additional shifts and deformations during contacting, because once the two plates are in contact any position error cannot then be corrected.

Previously, soft-stamp imprint lithography methods could not achieve accurate overlay alignment below tens of microns, as the soft stamp would introduce strong distortions. However, it has been shown that with SCIL and with a proper stamp design and stamp placement tooling, non-distorted imprints and nanometer accuracy overlay can be achieved.

The SCIL process makes use of a plate having an array of channels to which a vacuum (negative relative pressure) or a positive pressure can be applied. The pressure controls the suction of a stamp against the plate, or else the pushing of the stamp against the target substrate. In the commercial SCIL tool the alignment procedure involves placing the stamp in a flat configuration on the plate, with all channels applying a vacuum. The substrate is aligned with respect to the stamp. A shift-offset correction method is then applied. This involves bringing a bulge of the stamp into contact with the substrate, and measuring the alignment when there is contact.

The bulge is released so that contact is removed, and position adjustments can be made, before the bulge is again brought into contact with the substrate.

This correction process takes time. First, the shift-offset has to be determined. The eventual overlay error is caused both by the shift-offset and the tool alignment error. The shift-offset is caused by the stamp being initially bulged in order to bridge the gap to the substrate. This bulging of the stamp from its flat state to a state with a bulge gives rise to an offset which is reproducible only with an accuracy of 100-1000 nm.

WO 2008/087573 discloses the known imprint method in more detail, and also discloses an improvement which involves maintaining contact with a bulged portion of the stamp while the position adjustments are made.

FIG. 1 shows in simplified form the approach disclosed in WO 2008/087573.

A stamp 10 is held by a plate 110. Opposite the plate 110 is a substrate carrier 120 which is movable laterally and thus functions as an actuated chuck. The target substrate (not shown) is mounted on the substrate carrier 120. There is also a reference carrier 122. The reference carrier 122 and substrate carrier 120 are movable with respect to each other to provide the required alignment correction.

A bulge is formed in the stamp 10 and is brought into contact with the reference carrier 122, as shown in the top image. The bulge is increased in size to reach an alignment marker on the substrate carrier 120 so that alignment can be tested, as shown in the middle image.

If alignment is needed, the bulge is reduced in size (in this case bulge width) to release the stamp 16 from the substrate carrier so that the substrate carrier can be moved.

Thus, the top and middle steps shown in FIG. 1 are repeated until the alignment is correct. The process then proceeds with full application of the stamp to the target substrate carried by the substrate carrier 120 as shown in the bottom image.

This process allows alignment measurements to be made with the stamp kept in contact with the reference carrier. The contact ensures that the only effect of the Moiré pattern is caused by an in-plane shift, with no influence of height. The transition from small bulge to full contact is more reproducible than the process of repeating the initial contact after an alignment measurement. As a result, this process enables more accurate control of the stamp alignment.

However, this method requires a special substrate carrier in the form of the substrate carrier and reference carrier (anchor), which is not standard in mask aligner tools for which SCIL add-on tooling is available.

There is therefore a need for an accurate alignment method and apparatus which is suitable for use within an imprint lithography method, and which in that case requires reduced modification to conventional mask aligner tools.

SUMMARY OF THE INVENTION

The aforementioned need is at least partly fulfilled with the method, and apparatus provided according to the invention.

The invention is defined by the independent claims. The dependent claims provide advantageous embodiments.

The method of the invention is based on the recognition that a flexible stamp can be reproducibly placed back with nanometer accuracy onto a carrier or a substrate when starting from a partially bulged stamp and do accurate alignment of this partially bulged stamp. Thus, the method involves determining and adjusting alignment whilst maintaining a partial stamp bulge in the flexible stamp. This allows a less complicated method and a more straightforward design of the substrate carrier and nano-positioning equipment. In this way, less complex tooling is required and faster throughput can be achieved. The method may be directly applicable to commercial SCIL tooling to reduce the introduced flexible layer shift.

Step (a) and (b) can be performed in this order or the reversed order or at the same time. In one embodiment step (b) is performed before step (a). Within the context of the invention, the following terms are explained in more detail below.

A stamp bulge can be a stamp bulge having a stamp bulge onset on one side of the stamp bulge and a further onset on another (opposite) side of the stamp bulge. The bulge may take the form of a protrusion in an otherwise relatively flat stamp such that the entire bulge is surrounded by an onset of bulging. The protrusion can be elongated along one direction with respect to another direction perpendicular to the one direction. The protrusion can have a square or rounded cross-section. Alternatively, and as defined between a first and second stamp the partial stamp bulge has an onset on only one of its sides (such as the right side of the flex stamp 10 in FIG. 1, while the bulge onset on the other side is actually not there (e.g. like when the stamp 10 in FIG. 1 would continue on the left side of the bulge at the anchor 122 surface right up to the left edge of the anchor 122.

A stamp bulge portion can be a flexible stamp area located in the stamp bulge. Preferably the stamp bulge portion is a stamp area in the top of the stamp bulge. A stamp bulge is partial when the bulge is insufficient or insufficiently high to cause the stamp bulge portion to make mechanical contact with the substrate carrier or a substrate carried by the substrate carrier. Accordingly, a stamp bulge is full when the stamp bulge portion is in mechanical contact with the substrate carrier or a substrate carried by the substrate carrier.

A portion of the flexible stamp outside the at least partial stamp bulge can be at the onset of the partial or full stamp bulge. It may also be further away from the stamp bulge especially when the stamp is essentially in a flat or slightly curved plane or held by an essentially flat or slightly curved carrier surface.

A flexible stamp can have a stamping area on a stamping surface to be brought in contact with the substrate, or with a dummy substrate if so needed. The stamping area can have partial or complete coverage with a relief pattern depending on user need.

The stamp bulge portion of step (a) can be part of the stamping area, but it can also be separate from and/or abutting the stamping area.

The flexible stamp feature in step (d) can be part of the relief pattern in the stamping area, but can also be a feature separate form that such as a flexible stamp alignment marker.

Lateral alignment in step (d) means relative alignment in the X- and/or Y-direction between stamping surface of the flexible stamp and the substrate carrier surface or the substrate surface to receive the stamping surface of the flexible stamp. Here the X- and Y-direction are part of Cartesian coordinate grid where the Z-direction is used to define the distance between carrier or substrate and the flexible stamp.

Lateral translation thus can comprise translation along one or both of the X- and Y-directions.

The at least partial stamp bulge and the minimum of the at least partial layer stamp bulge do not need to be the same, but preferably are, as then stress forces that can lead to alignment mismatches are kept the same in the different steps of the method. The minimum of the at least partial stamp bulge can mean a minimum height of the stamp bulge and/or a width of the stamp bulge. The height is preferably measured in the stamp bulge portion as the distance from the stamp to a possible stamp carrier. The width of a bulge is measured at the base of the bulge possibly at the carrier surface from one onset of bulge to another onset of the bulge at the other side of the bulge or to the edge of the stamp if no such other bulge onset is present.

The partial flexible stamp bulge can be controlled to cross at least 20% of the gap between the first and second carriers or between the flexible stamp and the substrate whatever situation is suited best or implemented. Thus, a significant bulge remains which enables the accuracy improvements to be obtained by providing a predefined stressed state in the flexible stamp.

The size of the partial stamp bulge which is required to achieve the desired accuracy improvements may depend on the absolute size of the gap. For example, for an apparatus that comprises a constant pressure system to manipulate the flexible stamp, the bulge size will be determined by the number of engaging elements which are activated. A full bulge to cross a small gap will require fewer activated engaging elements, so that there are fewer possible partial bulge sizes. For example, for a gap of 100 µm, a full bulge may be obtained by activating between 8 and 12 activating elements. It may then be appropriate for the partial bulge height to be as low as 20 µm. For a gap of 20 µm, a partial bulge height of around 15 µm may be desired.

There may be a minimum height for the partial bulge, for example of at least 10 µm.

There are at least two conceptually different ways to the implement the method giving rise to a dynamic approach embodiment and an iterative approach embodiment.

In the dynamic approach embodiment the steps (c) to (f) are performed one or more times and after the final performance of step (f), the at least partial stamp bulge has become a full stamp bulge such that at least the stamp bulge portion is in mechanical contact with the substrate. Thus, the bulge is a partial stamp bulge such that the stamp bulge portion does not make mechanical contact with the substrate carrier or a substrate carried by the substrate carrier. Measuring an alignment is with the partial flexible stamp bulge in place, preferably using features at the location of the stamp bulge portion. The measurements and possible adjustments are repeated after which final contact is made.

The number of repeats can be based on an alignment threshold such that if alignment after a certain step is found to be sufficient, it is decided that the last step (f) is performed. The stop of step cycling can also be made dependent on the actual distance that has to be spanned by the advancement in order to make contact. The larger the distance to be spanned still, the more repeat cycles are still performed. In a simple embodiment, the number of repeat cycles is just predetermined by the user and the distance to be spanned by the advancement divided by the number of cycles.

This method provides non-contact alignment measurement, it can in the ultimate case be even in a dynamic way if repeating of the steps is carried out, while the partial flexible stamp bulge is increased in size continuously towards full size flexible layer bulge and thus eventually causes the stamp bulge portion to come into mechanical contact with the substrate carrier or a substrate carried by the substrate carrier.

In the iterative approach step (a) comprises that the at least partial stamp bulge is a full stamp bulge such that at least the stamp bulge portion is in mechanical contact with the substrate. Also, step (f) comprises retracting the stamp bulge portion from the substrate to release the mechanical contact while at least the minimum of the at least partial stamp bulge is kept in place before making the required lateral adjustment in step (e).

In this embodiment a full flexible stamp bulge which crosses the gap to make contact with the substrate is used and the step of measuring an alignment is carried out with the stamp bulge portion in contact with the substrate or the second carrier. Preferably the alignment is now measured at the stamp bulge portion. This gives very accurate alignment measurement. Then, if alignment adjustment is needed the embodiment comprises retracting the stamp bulge portion to release contact with the substrate in order to allow making the lateral adjustments without distorting or destroying the flexible stamp or its features and/or the substrate. The stamp bulge is preferably only retracted back to a minimum extent giving an almost fully advanced partial stamp bulge that has the stamp bulge portion almost in mechanical contact with the substrate or a substrate carrier. This almost advanced stamp bulge is more advanced than the minimum at least partial stamp bulge. The almost advanced layer bulge can be such that it crosses the gap by more than 70%, more than 80%, more than 90% of the gap distance.

This method thus uses contact between the bulge and the substrate to make alignment measurements, but when releasing contact to enable the relative movements to be made, the bulge is only retracted back to a minimum extent. This method can give very accurate alignment measurements in one step at the expense of having to make contact at least once and in the first step. This is then preferably done at a location of alignment markers outside the location of the actual stamping area allowing mechanical contact at a dry are of any substrates to be imprinted when the method is used in an imprinting method.

In a preferred embodiment advancing the stamp bulge portion in step (f) comprises growing the at least partial flexible stamp bulge. In this embodiment preferably the stamp carrier is not moved with respect to the substrate carrier or the substrate to effectuate advancement. As opposed to moving the entire flexible stamp or its carrier together with the stamp to effectuate the advancing, the way of advancing by growing a partial stamp bulge was surprisingly found to be very accurate when it comes to reproducibility and relatively easy to achieve (e.g. with less costly equipment) when compared to having to advance by relative movement.

If retraction of any stamp bulge portion away from the substrate or its carrier is needed, such as retraction of the full stamp bulge before being able to make lateral alignment adjustments, such retraction preferably comprises shrinking the full flexible stamp bulge. Again in such case retracting does not involve relative movement of the entire stamp and substrate or their carriers with respect to each other.

The growing and shrinking of bulges can be advantageously done with an embodiment wherein engagement elements are used as described herein below.

The flexible stamp features located in the stamp bulge portion and/or the substrate feature located in the substrate can be alignment markers. Alignment markers preferably are interference markers such as interference gratings. Then measuring a lateral alignment can be done by measuring an extent of interference (mis)match. Thus the measuring may comprise optically analyzing the interference between interference gratings. The term "optically" can include radiation spanning the UV-Vis to near infrared range depending on the needs. Preferably UV and or visible light is used. In any case, other means of alignment measuring can be used with the invention without loss of advantage.

Alternatively, and especially in combination with the non-contact approach of alignment described herein before, the stamp feature may be a feature of a relief pattern comprised within the stamp area and the substrate feature may be a substrate pattern feature of a top patterned layer of the substrate such as resulting from a previous patterning step.

The method can include that comparing the measured lateral alignment with a predetermined minimum lateral alignment and if the measured lateral alignment is worse than the predetermined minimum lateral alignment determining that adjustment of lateral alignment is needed. Predetermined may be user defined.

The method can comprise after step f, performing the step (g) of moving the full flexible stamp bulge across the flexible layer to cause the stamp bulge portion that is in mechanical contact with the substrate to extend in the stamping area of the flexible stamp. Extend in the stamping area can mean that the stamp bulge portion in contact with the substrate was already in the stamping area after step (f), but that with step (g) this part of the stamp bulge portion grows. It can also mean that the stamp bulge portion in contact with the substrate was not already part of the stamping area and step (g) now causes it to extend into the stamping area. Preferably the extension of step (g) is such that at one point in time the entire stamping area is or has been in contact with the substrate for a defined period of time. Thus, the full stamp bulge may run along the flexible stamp in a direction thereby creating contact on the forward side of the bulge while at the same time breaking contact at the trailing side of the bulge such that the contact is established in wave like fashion.

Alternatively the bulge may grow extend along the flexible stamp to bring the entire stamping area in contact with the substrate. This way of creating contact is very reproducible, gentle and allows precise stamping without losing substantial alignment along the flexible stamp with the performance of step (g). in this embodiment, extending in the stamping area of the flexible stamp (for stamping) can be in one direction while retreating out of the stamping area (for releasing of the stamp from the substrate) can be in another direction such as for example a direction perpendicular or opposite to the one direction.

The method preferably comprises that if the flexible stamp comprises a stamping area, moving the at least partial stamp bulge across the flexible stamp to cause that at least the entire stamping area has been part of the at least partial stamp bulge before step (c) is performed. The creation of the first bulge in an otherwise flat flexible stamp creates some stress in the stamp. Running or extending the stamp bulge along the flexible stamp relieves at least some of the stress and improves the reproducibility and/or accuracy of the method of alignment. Moving the bulge can again mean moving the bulge along and/or extending the bulge over the flexible stamp. The step can be repeated several times if needed before performing step (c).

In an embodiment of the previous paragraph, moving the at least partial stamp bulge across the flexible stamp in step (a) comprises: that the at least partial stamp bulge is a full partial stamp bulge of which the stamp bulge portion is in mechanical contact with a dummy substrate; after the moving the at least partial stamp bulge across the flexible stamp, retracting the full stamp bulge from the dummy substrate to form the at least partial stamp bulge; and before step c is performed, replacing the dummy substrate with the substrate. Running the stamp bulge across the flexible stamp to relieve stress in the flexible stamp under conditions similar to or identical to conditions under which the actual stamping takes place provides further improved accuracy in alignment and reproducibility of the alignment.

The invention can be used in an imprint method. Thus according to the invention there is provided an imprinting method comprising a method of contacting as claimed, wherein the flexible stamp comprises a stamping area, wherein the stamping area comprises a relief pattern to be transferred to an imprintable surface of the substrate. In other words, the method of contacting may comprise a method of imprinting a substrate. The flexible stamp then carries an imprinting pattern. The imprinting pattern can face an imprintable layer on a substrate.

The imprintable layer preferably is an imprint resist layer. The method may further comprise developing the imprint resist layer for example by solidifying the resist layer during imprint stage upon a physical stimulus such as light, heat or stamp exposure and releasing the stamp from the developed resist layer.

In all applications, each engaging element preferably comprises an aperture, wherein in the first configuration the aperture is arranged to provide an under-pressure to the flexible layer and wherein in the second configuration the aperture is arranged to provide an overpressure to the flexible layer. The overpressure may be varied to control the size of the partial bulge.

In other words before positioning the first carrier including the flexible layer relative to a second carrier, the method may further comprise performing a flexible layer stress reduction by advancing a flexible layer bulge across the flexible layer.

This can release stresses which arise from the manual handling of the flexible layer. In this way, a bulge wave is run across the flexible layer, and this can be carried out a number of times.

Again, before positioning the first carrier including the flexible layer relative to a second carrier, the method may further comprise performing a flexible layer stress reduction by fully advancing the flexible layer against a dummy substrate. This can be from an initial bulge to full contact and also back to the initial bulge. This further releases stresses in the flexible layer.

The method may be a substrate conformal imprinting lithography (SCIL) method or any other suitable imprinting method. However, it may also be a method of bonding layers together or a method of transferring one layer onto another. Stacking of layers to form devices is for example used in MEMS devices, and this invention can be used for a mechanical transfer of one layer onto another with accurate alignment. For example, two wafers (at least one of which is flexible) may be bonded together with accurate alignment. Alternatively, a polymer layer, which for example may include nanoparticles, may be applied to a substrate with accurate alignment.

The invention provides a computer program product downloadable from a communication network and/or stored on a computer-readable and/or microprocessor executable medium, the computer program product comprising computer program code instructions for implementing a method as claimed in any one of the preceding claims. The implementation can commence when the program is run on a computer.

The invention further provides a controller for controlling an apparatus for performing a method of the invention, where the controller comprises the computer program product of the invention. The controller may be one for an imprinting apparatus in particular a SCIL imprinting apparatus.

The invention further provides an apparatus for performing any one of the methods of the invention, where the apparatus comprises:
  the controller of the invention;
  a stamp carrier controlled by said controller, the stamp carrier comprising a plurality (in particular and preferably an array) of engaging elements disposed across the area of the stamp carrier, each engaging element being individually switchable by the controller between a first configuration in which a flexible stamp if carried by the stamp carrier, is pulled towards the stamp carrier and a second configuration in which the flexible stamp is pushed away or released from the stamp carrier; and
  a substrate carrier for carrying the substrate and/or for carrying the dummy substrate.

The stamp carrier of this apparatus provides a good way of controlling bulging, advancing and/or retracting and/or moving of a bulge in a flexible stamp. This is especially so when an array of elements disposed across the stamp carrier and thus across a flexible stamp carried by the carrier is present. Local control of manipulation of a stamp is thus provided.

The apparatus can be a stamping apparatus, a printing apparatus and preferably is an imprinting apparatus.

The substrate carrier may also be controlled by the controller. Either or both of the stamp carrier and the substrate carrier can be movably mounted in the apparatus and the respective ones are then controlled by the controller. This way of mounting allows positioning and/or lateral alignment as defined in the method of the invention by moving the carriers relative to each other.

Engaging elements can comprise electromechanical elements such that pulling, pushing or releasing comprises change of electromechanical force exerted on a substrate. Switching can be electrically controlled with such elements. In a preferred embodiment, each engaging element comprises an aperture, each aperture comprising a valve for switching the aperture between an under-pressure channel in the first configuration and an overpressure channel in the second configuration, said valve being controlled by said processor. The pressures can again be controlled electrically using pump equipment. This aperture based elements provides simple and accurate control.

The apertures of the stamp carrier may be elongated in one direction and be groove-shaped if they comprise the apertures. It should be understood however that any suitable shape may be used for these elements and or apertures, e.g. round shapes, oval shapes, oblong shapes and so on.

In a particularly advantageous embodiment, the overpressure channel of the apparatus may comprise a pressure regulator controlled by said processor.

BRIEF DESCRIPTION OF THE DRAWINGS

Embodiments of the invention are described in more detail and by way of non-limiting examples with reference to the accompanying schematic drawings, wherein.

DETAILED DESCRIPTION OF THE EMBODIMENTS

Figure 1:
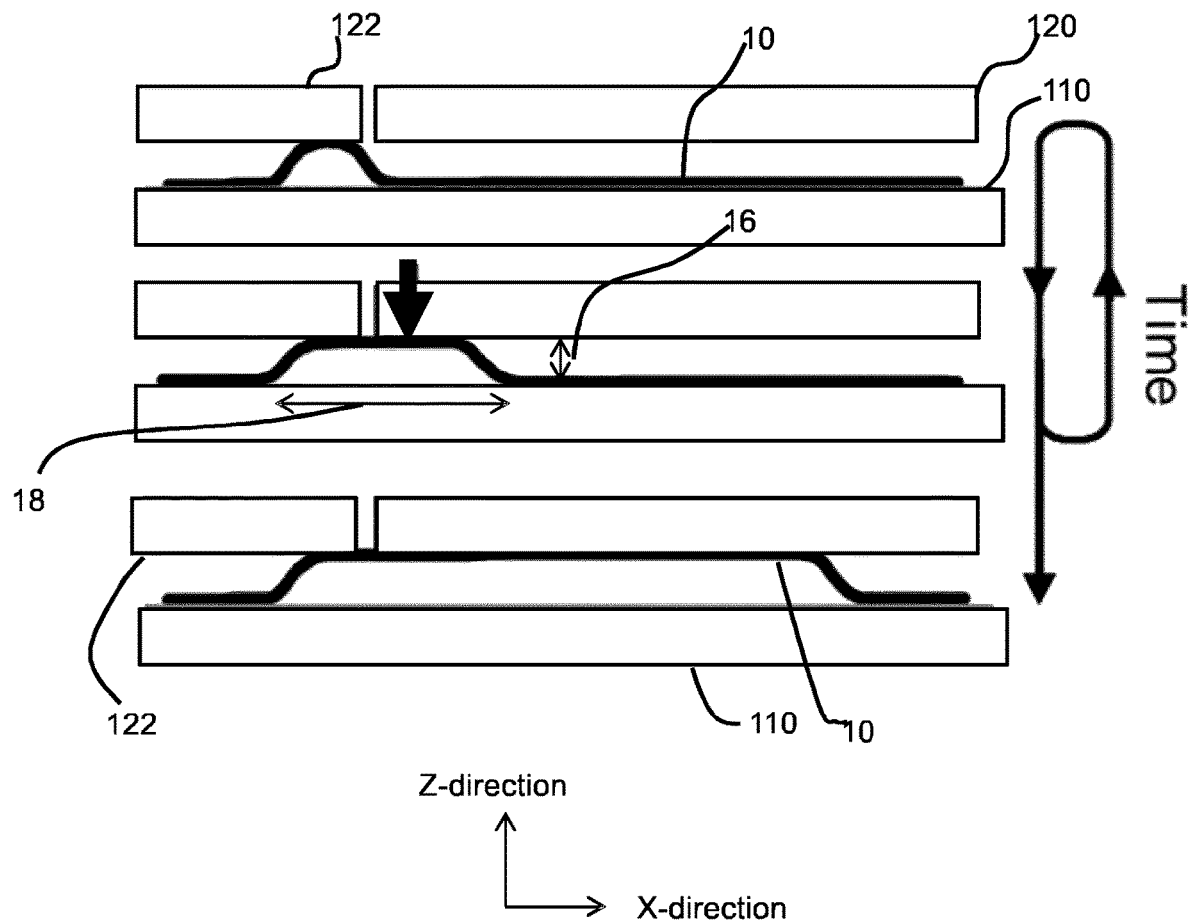
FIG. 1 shows in simplified form the approach disclosed in WO2008/087573.

It should be understood that the same reference numerals are used throughout the Figs. to indicate the same or similar parts.

The invention provides a method of transferring a flexible layer to substrate in which a partial flexible layer bulge is used, which does not make contact with the substrate. The partial bulge advances towards the location of an alignment marker on the substrate. When alignment adjustments are needed, they are made with the partial bulge in place so that more reproducible positioning is possible when fully advancing the flexible layer against the substrate.

The invention will be described with reference to the preferred application of the invention, which is for imprinting and in which a pattern is imprinted into a resist layer on the substrate. In this application of the invention, the invention enables a more conventional printing apparatus to be used, and to be controlled to operate in an advantageous new manner.

Figure 2:
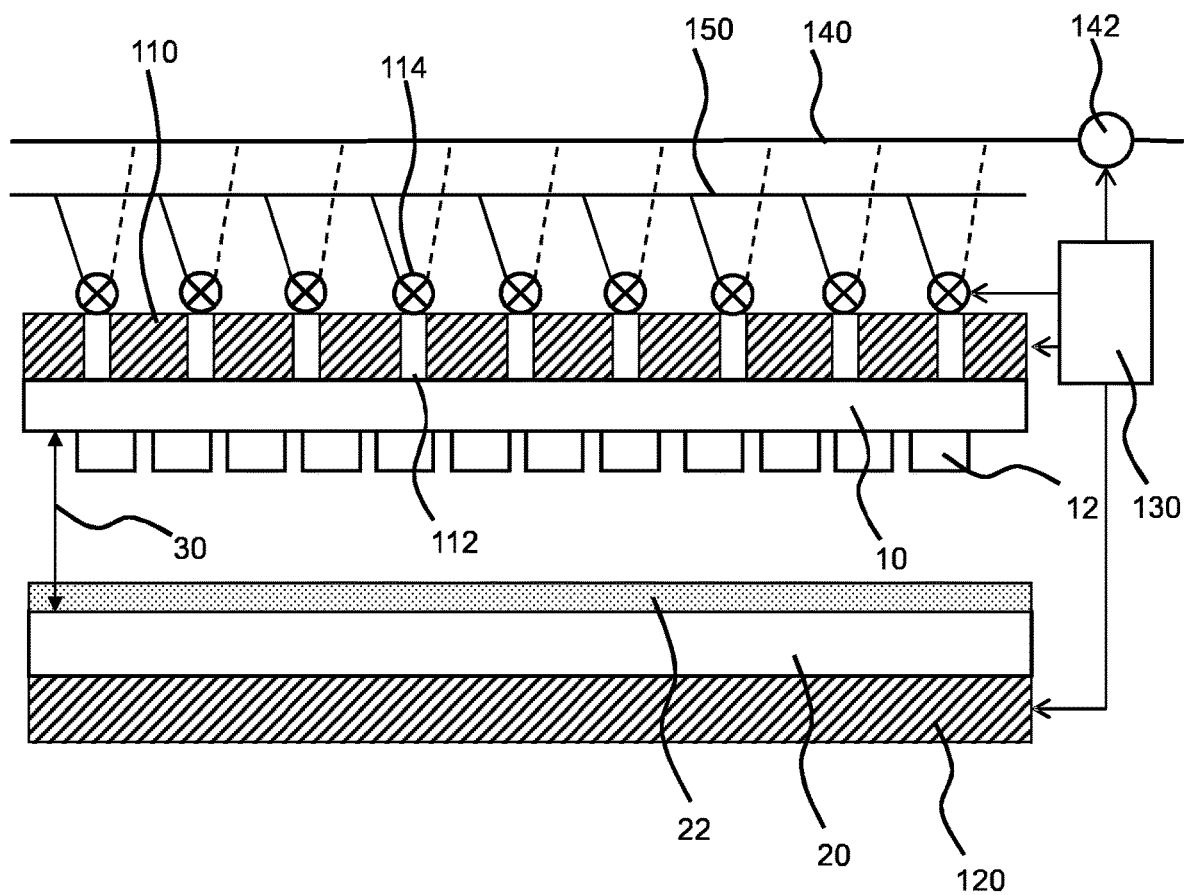
FIG. 2 shows an imprinting apparatus according to an embodiment of the present invention.

FIG. 2 depicts a known imprinting apparatus 100 which can be controlled to operate in accordance with the present invention.

The imprinting apparatus 100 may be a SCIL imprinting apparatus or any other suitable imprinting apparatus that can be used to transfer a nanoscale imprinting pattern from a (flexible) stamp to a substrate. Examples of such apparatuses are disclosed in and the contents of these disclosures are incorporated by reference. Especially the parts of the disclosures describing the ways to manipulate a flexible stamp such as the construction of carries, chucks, engaging elements and pneumatics can be used to implement with the current invention.

The same reference numbers are used throughout the figures for the components which perform the same function. Note that FIGS. 2 to 9 show the apparatus in the opposite (up-down) orientation with respect to FIG. 1.

The imprinting apparatus 100 typically comprises a first holder or carrier 110 for holding the flexible stamp 10 including an imprinting pattern 12. The flexible stamp 10 and imprinting pattern 12 may be realized in any suitable material. Typically, a multi-layer structure is used, such as a thin flexible glass or other carrier, which provides the desired stiffness in the x-y plane but is flexible in the z-direction. A soft stamp is provided over the top e.g. a suitable (synthetic) rubber material such as a polysiloxane-based material, e.g. polydimethylsiloxane (PDMS) or cross-linked perfluoro-polyether (PFPE). Further layers may be used, such as a thin rigid rubber which holds the nano-features. The feature size of the imprinting pattern may be any suitable size, and preferably is a nanoscale pattern, that is, a pattern having feature sizes as low as 10 nm up to in excess of 1 mm, with an aspect ratio (vertical dimensions divided by lateral dimensions) of the features may be 8 or higher. It should however be understood that other feature sizes may also be contemplated, and that the present invention equally may be applied to transfer nanoscale patterns having smaller aspect ratios. For instance, at least some embodiments of the present invention are suitable to transfer imprinting patterns with an aspect ratio in the range of 0.001 to 10.

To this end, the first carrier 110 typically comprises a plurality of stamp engaging elements 112, which may be arranged in an array or grid. Such stamp engaging elements 112 are typically arranged to pull a portion of the flexible stamp 10 towards the first carrier 110 in a first configuration and to push the portion of the flexible stamp them away from the first carrier 110 in a second configuration.

In the following detailed description, the stamp engaging elements 112 are embodied by apertures that can be switched between an under-pressure (vacuum) and an over-pressure in order to provide the first and second configuration respectively. However, as will be explained in more detail later, it is equally feasible to use other types of stamp engaging elements 112, e.g. mechanical stamp engaging elements or electromechanical engaging elements that allow manipulation using electromechanical forces (electric or magnetic) for the grab and release of a stamp.

The apertures 112 may have any suitable shape. For instance, the apertures 112 may be groove-shaped, with the grooves extending over substantially the whole length of the first carrier 110; the apertures 112 may be a circular-shaped, with the apertures 112 defining a two-dimensional grid. Other suitable shapes will be apparent to the skilled person. Groove-shaped apertures 112 are for instance suitable in case the imprinting direction and the release direction of the flexible stamp are the same or opposite to each other. A two-dimensional grid of circular apertures for instance is particularly suitable in case the imprinting direction and the release direction of the flexible stamp 10 are different to each other.

Each aperture 112 comprises a valve 114 that can switch the aperture 112 between an overpressure source provided via first channel 140 (from here on referred to as the overpressure channel) and an under pressure source, e.g. vacuum pump, provided via second channel 150 (from here on referred to as the under-pressure channel). The connection between each valve 114 and the under-pressure channel 150 is shown by solid lines and the connection between each valve 114 and the overpressure channel 140 is shown by dashed lines.

The respective valves 114 are typically controlled by a processing element (processor) 130, which may take any suitable shape or form. The processing element 130 typically executes computer program code that instructs the processing element 130 on how to control the valves 114 and the first carrier 110 during the imprinting process, as will be explained in more detail later.

The flexible stamp 10 may be affixed to the first carrier 110 by switching the apertures 112 to an under-pressure. Additional affixing means may be provided, for instance around an edge portion of the flexible stamp 10. Such affixing means may for instance comprise clamps clamping the edge of the flexible stamp 10 to the first carrier 110 although it should be understood that in at least some embodiments no additional affixing means are being used.

The imprinting apparatus 100 further comprises a second holder or carrier 120 for carrying a substrate 20 to be imprinted or for holding a dummy substrate. Any suitable substrate 20 may be used, e.g. any suitable (semiconductor) substrate such as a silicon substrate, a silicon-on-insulator substrate, a silicon germanium substrate, glass, sapphire and so on. To this end, the substrate 20 may carry an imprintable layer such as e.g. a resist layer 22, which may be any suitable material that can be solidified after contacted with the stamp. For instance, the resist layer 22 may comprise a curable material that may be solidified (cured) to immobilize the imprinting pattern 12 in the resist layer 22. In an embodiment, the resist layer 22 comprises a sol-gel material. A suitable example of such a material is disclosed in WO 2009/141774 A1, although it should be understood that any suitable resist material may be used. Further examples of suitable resist materials for instance can be found in US 2004/0261981 A1, WO 2005/101466 A2, US 2005/0230882 A1, US 2004/0264019 as well as in the non-patent publication Advanced Materials, 1998, Vol. 10(8), page 571.

In an embodiment, the first carrier 110 is controlled by the processing element 130. To this end, the imprinting apparatus 100 further comprises means for positioning and repositioning the first carrier 110 relative to the second carrier 120 including in three dimensions represented by the three Cartesian coordinates X, Y, Z under control of the processing element 130. Furthermore, there may be provided means for adjusting the relative positions laterally (in a direction parallel to the second carrier 120), vertically (in a direction perpendicular to the second carrier 120) both using translation and orientation. In this example the apparatus includes automated displacement means under control of the processing element 130. The automated displacement means may include for example mechanical or electrical units providing mechanical or electrical feedback mechanisms for precisely controlling the relative XYZ positions and orientation of the first carrier 110 relative to the second carrier 120. The position control is with nanometer accuracy. Such displacement means are known per se and are therefore not described in any further detail for the sake of brevity only.

The second holder or a carrier 120 optionally may also be controlled by the processing element 130 in a manner analogous to the above control means for the first holder or carrier 110, to increase the degrees of freedom of the imprinting apparatus 100. However, it is equally feasible to provide an imprinting apparatus 100 having a stationary or fixed second carrier 120.

In an embodiment, the first carrier 110 is separated from the second carrier 120 by a gap 30, which gap size may be controlled by the processing element 130, e.g. by engaging the means for positioning and repositioning the first carrier 110 relative to the second carrier 120. In a particular embodiment, the processing element 130 may be programmed to alter the gap size in between the imprinting step and the release step. Specifically, the processing element 130 may be programmed to increase the gap size upon completion of the imprinting step (and after developing the resist layer 22) as increasing the gap size can aid the release of the imprinting pattern 12 from the developed resist layer 22, as will be explained in more detail below.

In an embodiment, the overpressure channel 140 may include a pressure regulator 142 under control of the processing element 130. This for instance facilitates varying the overpressure during an imprinting or release step as will be explained in more detail later.

The imprinting apparatus 100 may have a user interface, e.g. a user terminal including at least one instructions input device such as a keyboard, mouse, trackball, and so on for allowing the user to configure the imprinting apparatus 100 in accordance with the desired imprinting process. It should be understood that any suitable user interface may be used.

As mentioned above, the processing element 130 is arranged to control the first carrier 110, the valves 114 and/or the pressure regulator 142 in accordance with an embodiment of the imprinting method of the present invention. The control process can use optical feedback of the alignment marker positions to provide an iterative control process.

For controlling the process, the imprinting apparatus 100 further comprises a computer-readable data storage medium (not shown), such as a memory device, e.g. Flash memory, RAM or ROM, a solid state disk, a magnetic disk and so on. The data storage medium comprises computer program code for execution by the processing element 130, which computer program code causes the processing element 130 to implement the various steps of the imprinting method in accordance with embodiments of the present invention. The data storage medium may be located in any suitable location of the imprinting apparatus 100; the data storage medium may be integral to the processing element 130 or may be a discrete component accessible by the processing element 130 in any suitable manner, e.g. over a data communication bus or a point-to-point connection between the processing element 130 and the data storage medium.

A known imprinting process using the imprinting apparatus 100 is as follows. A flexible stamp 10 comprising an imprinting pattern 12 is affixed to the first carrier 110, for instance by switching the valves 114 such that the apertures 112 are connected to under-pressure channel 150, which channel may be connected to an under-pressure-providing source such as a vacuum pump. The first carrier 110 is subsequently positioned over the second carrier 120 carrying the substrate 20 coated with resist layer 22, such that the imprinting pattern 12 faces the resist layer 22. The first carrier 110 is typically positioned relative to the second carrier 120 such that a gap 30 exists between the first carrier 110 and the second carrier 120, which gap 30 may be defined by the user of the imprinting apparatus 100 to ensure a good conformal contact between the flexible stamp 10 and the substrate 20 during imprinting. The gap 30 may be chosen in any suitable range; for instance, in a typical SCIL process in which the imprinting pattern 12 is a nanoscale pattern, the gap 30 be chosen in a range from 10-500 μm, preferably in a range from 20-200 μm, more preferably in the range from 15-100 μm.

Upon positioning the first carrier 110 relative to the second carrier 120, the imprinting process proceeds with an imprinting step, in which a contact area is created between the flexible stamp 10 and the substrate 20, which contact area is gradually expanded until the entire imprinting pattern 12 intended to contact the substrate 20 is brought into contact with this substrate.

Figure 3:
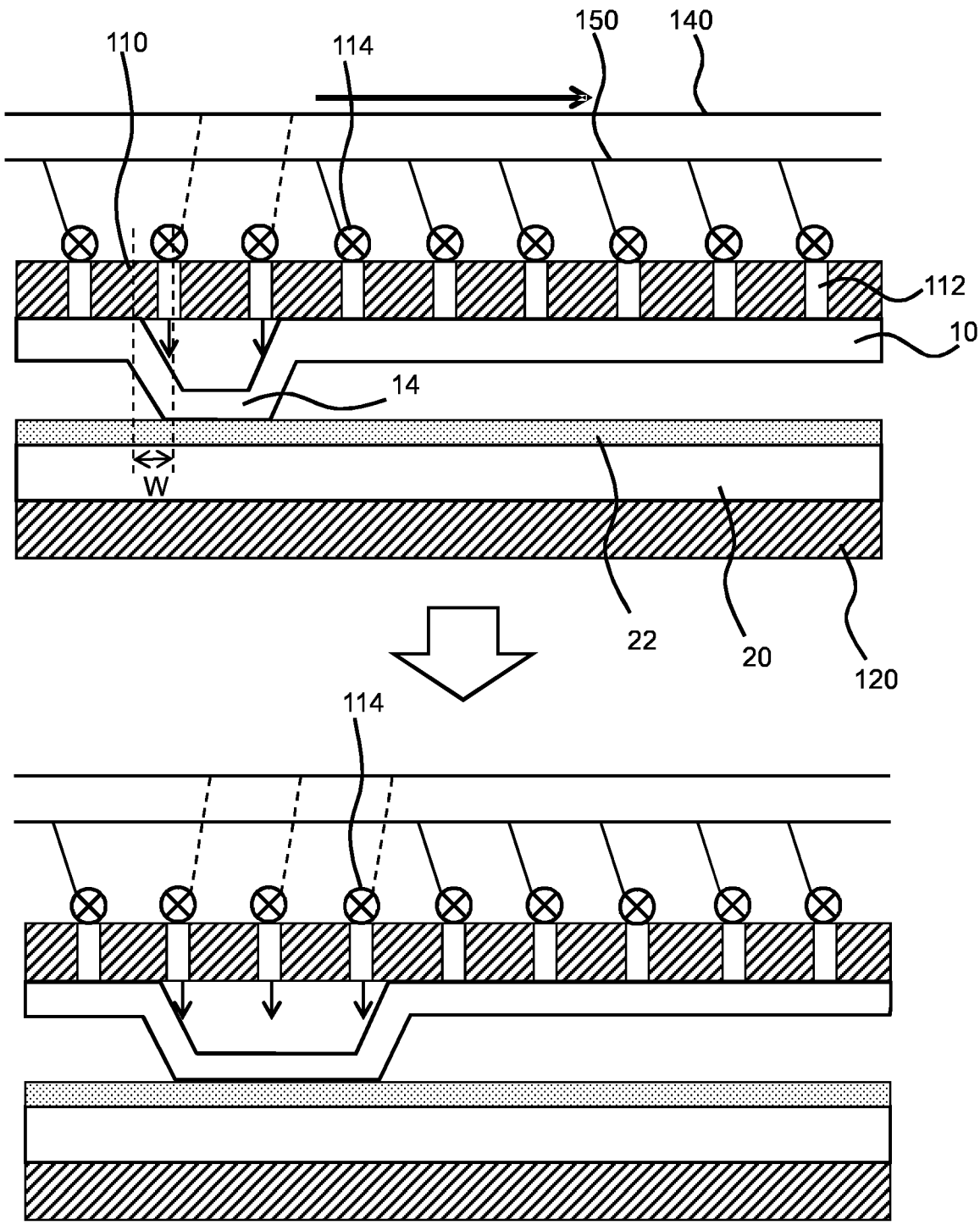
FIG. 3 shows an imprinting cycle using the imprinting apparatus of FIG. 2.

This is explained in more detail with the aid of FIG. 3. It is noted that in FIG. 3 the imprinting pattern 12 has been omitted for the sake of clarity only; this should not be construed as the imprinting pattern being absent.

As can be seen in the upper pane of FIG. 3, an initial contact area 14 is created between the flexible stamp 10 and the substrate 20 by individually switching selected apertures 112 from under-pressure to overpressure in the direction of the horizontal arrow over the overpressure channel 140. In FIG. 3, only the selected connections between the valves 114 and the respective channels 140 and 150 are shown for reasons of clarity. This bulges part of the flexible stamp 10 away from the first carrier 110 towards the second carrier 120 in order to establish the contact area 14 between the flexible stamp 10 and the second carrier 120 including the substrate 20 carrying the resist layer 22. Note that there may be an opening in the resist layer within the contact area 14 where an alignment marker is provided on the substrate. The bulge can have a height 16 and width 18 as illustrated with the upside down bulge in FIG. 1. The bulge height extends in the Z-direction.

The contact area 14 is typically expanded by moving the contact front of the contact area 14 in the direction of the arrow by periodically switching the next aperture 112 from the under-pressure to the overpressure by controlling its valve 114, as shown in the bottom pane of FIG. 2. This process is repeated until the contact area 14 is established over the entire desired area of the substrate 20, i.e. the desired portion of the imprinting pattern 12 has been brought into contact with the resist layer 22. The rate of expansion of the contact area 14 is typically determined by the rate at which the next apertures 112 are switched to the overpressure, as well as by the gap 30. The associated bridge width W where the stamp is not contacted by either the first carrier 110 or the substrate 20 may for instance be chosen between 10 and 50 mm. The bridge width, which is mainly a function of the gap size, the bending stiffness of the flexible stamp 10 and the applied pressure, influences the obtainable imprint speed and stamp release speed. A larger gap allows for more substrate total thickness variation (TTV) and makes the gap setting less critical (e.g. more variation allowed, wedge). A smaller gap allows for faster imprinting speeds.

The rate of switching the apertures 112 to overpressure is typically chosen such that it is ensured that a good conformal contact is established between the imprinting pattern 12 and the substrate 20. Such good conformal contact is for instance achieved when the switching rate is chosen such that it allows the portion of the flexible stamp 10 to contact the substrate 20 to be pulled into the resist layer 22 by capillary forces originating from recesses in the imprinting pattern 12 of the flexible stamp 10, or onto a dry substrate 20 by Vander Waals forces. Note that air inclusions are for example avoided by ensuring that the (capillary) contact line advances at a similar or higher rate than the average speed caused by the switching.

Once the desired contact area 14 between the imprinting pattern 12 and the substrate 20 has been established, the resist layer 22 is subsequently developed, e.g. cured, in any suitable manner, for instance by exposure to an external stimulus such as UV or visible light, heat and so on. This solidifies the resist layer 22, which immobilizes the imprinting pattern 12 in the developed resist layer 22.

At this stage the gap 30 may be adjusted, i.e. increased, in order to reduce the duration of the release step in which the imprinting pattern 12 is released from the developed resist layer 22. Not all gap settings facilitate automatic release of the stamp. Depending on the type of imprinting pattern 12 and resist layer 22, the stamp 10 can be attached to the imprinted developed resist layer 22 by a relatively high contact area 14, and thus force. The release force that can be generated is higher for larger gaps 30. For instance, it is possible that a stamp 10 cannot be released from the developed resist layer 22 if the gap 30 is set to 50 micron, but can be released if this gap is 100 micron. This is due to the way the stamp is released, which as explained in more detail with the aid of FIG. 4.

During the release step, individual apertures 112 are switched from overpressure channel 140 to under-pressure channel (vacuum) 150 by the processing element 130 controlling the respective valves 114, which causes the flexible stamp 10 to move up, i.e. the flexible stamp 10 is peeled away from the developed resist layer 22, thereby sealing the vacuum and shortening the bridge length W by one aperture pitch. This increases the force on the contact surface 14 and as more apertures 112 are switched to under-pressure to displace the contact front of the contact area 14 in the direction of the horizontal arrow, as shown in the bottom pane of FIG. 4, the bridge is further shortened until the force is equal to the release force of the imprinting pattern 12 of the flexible stamp 10 from the developed resist layer 22 on the substrate 20 carried by the second carrier 120. This then relaxes by release of the stamp.

The imprinting process includes an alignment process. This involves establishing an initial contact area between the flexible stamp 10 and the second carrier 120. The region of the second carrier can comprise one or more alignment markers for correctly aligning the first carrier 110 relative to the second carrier 120. As explained above, conventionally, this contact is released and the stamp returned to flat, to allow alignment corrections.

This invention relates specifically to the alignment aspect.

The invention provides an alignment process that makes use of a partial bulge. By this is meant a bulge in the stamp which approaches the substrate to be printed, but does not make contact with it, so that relative movement between the stamp and substrate is still possible. For example, the partial bulge may extend across at least 20% of the height of the gap 30, and more preferably more than 30% of the gap height and even more preferably more than 50% of the gap height.

The size of the partial bulge will be determined by the number of apertures 112 to which pressure is applied and/or the pressure level. There may therefore be discrete possible sizes for the partial bulge, which depend on the number of apertures in the design and the gap size (using a constant pressure).

A full bulge to cross a small gap will for example require fewer activated apertures. For example, for a gap of 100 μm, a full bulge may be obtained by activating between 8 and 12 apertures. It may then be suitable for the partial bulge height to be as low as 20 μm. For a gap of 20 μm, a partial bulge height of around 15 μm may be desired.

The closer the partial bulge is to the substrate, the greater the accuracy improvement. The partial bulge has a maximum size which is as close as possible to crossing the full gap height but without making contact. For example, with the partial bulge in place, the gap between the tip of the partial bulge and the substrate may be less than 20 micron, for example less than 10 micron, possibly less than 5 micron. Of course, these values also depend on the size of the full gap.

When used as part of an imprinting method and apparatus, the invention aims to control more accurately the stamp alignment. A first consideration is to avoid residual stresses in the stamp, which can give rise to non-reproducible and unpredictable alignments.

Figure 5:
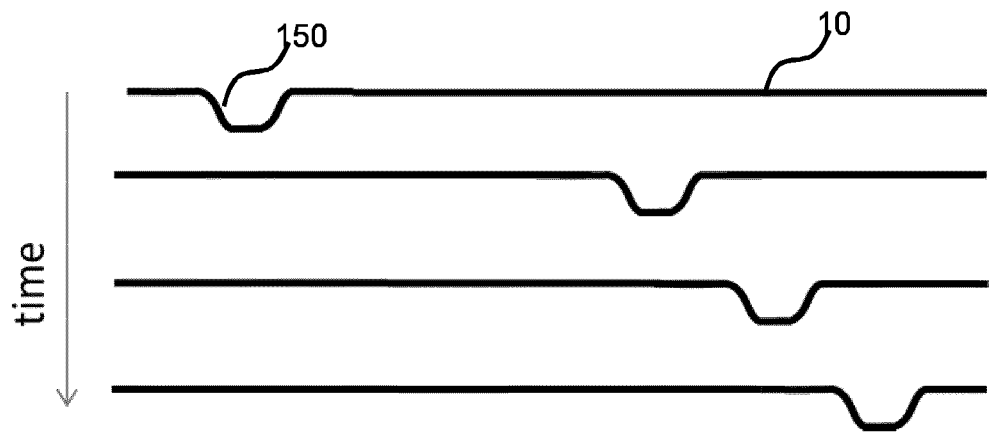
FIG. 5 shows a first stress release process which can be used in the method in accordance with an example of the invention.

FIG. 5 shows an approach for releasing stresses by running a bulge 150 across the stamp in the manner of a wave. This is to form a bulge in the stamp, and not to produce any contact with the substrate. This process can be repeated a number of times if needed. This process can be carried out before the substrate is brought into proximity with the stamp, and thus precedes the contacting and printing process.

Figure 6:
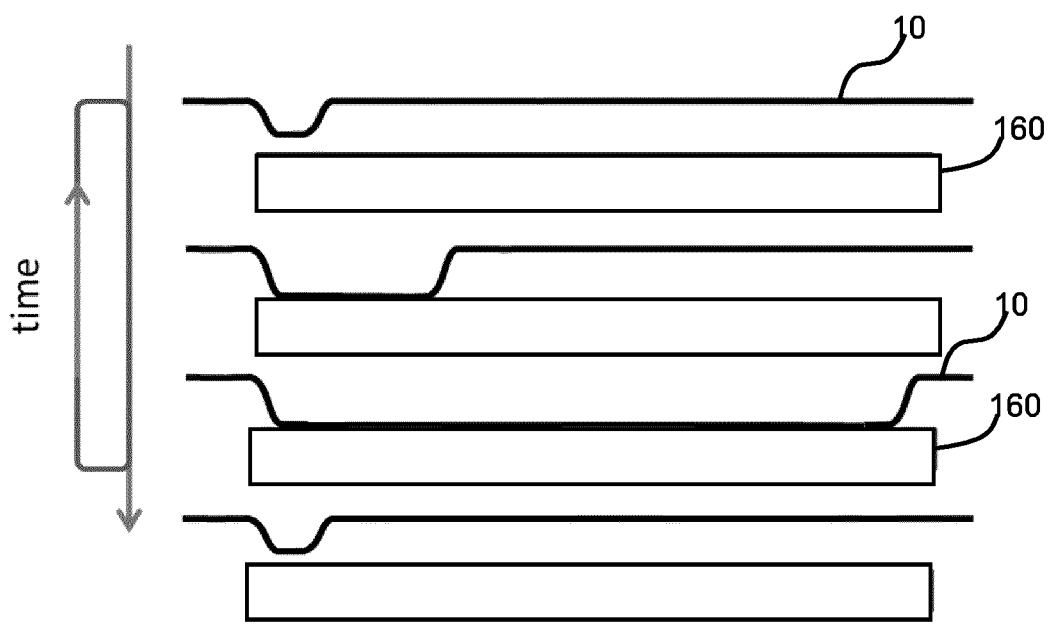
FIG. 6 shows a second stress release process which can be used in the method in accordance with an example of the invention.

FIG. 6 shows a further process which enables remaining stresses in the stamp to be substantially removed by repeatedly contacting a dummy substrate 160 with a gap set of equal thickness to that which will be used when printing, for example 10 to 100 micron. The process starts with a bulge, advances to full contact, and then returns back to the partial bulge position.

Figure 4:
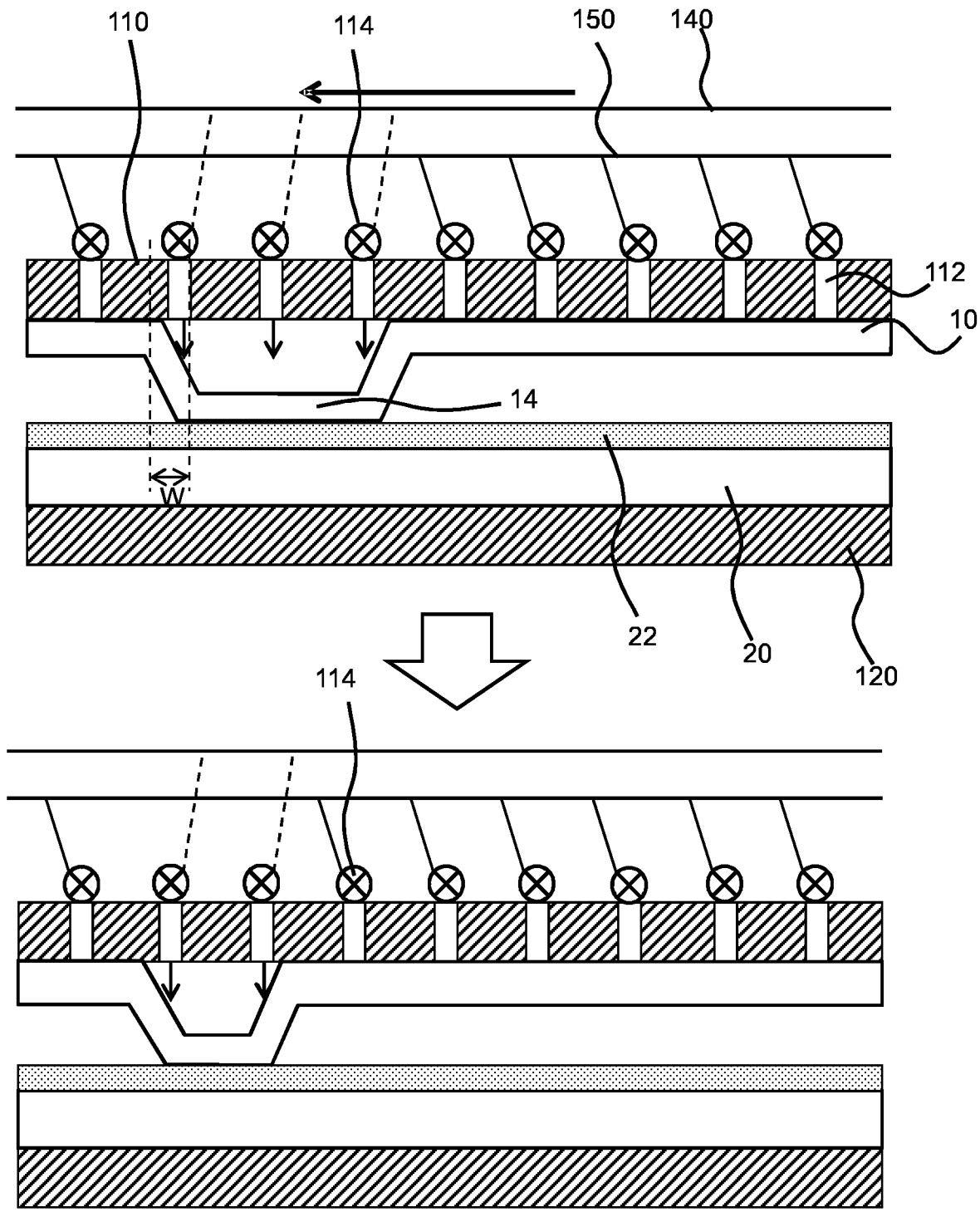
FIG. 4 shows a release cycle using the imprinting apparatus of FIG. 2.

These processes are controlled in the manner explained with reference to FIGS. 3 and 4. One or both of these steps may be used, or indeed they may not be necessary in some cases, depending on the properties of the stamp.

The invention makes use of the concept of a partial bulge which enables alignment to be established in a bulged configuration, but without needing a reference carrier in addition to the main substrate carrier. The bulged configuration provides a certain stress to the flexible stamp, which when absent during alignment, would lead to alignment mismatch when actual contact is established by making use of a bulge extending or moving along the flexible stamp and substrate.

A first approach, which can be considered to be an iterative alignment process, is explained with reference to FIG. 7.

Optionally, the process starts with one or both of the two stamp relaxation processes explained with reference to FIGS. 5 and 6. The active substrate is positioned in place, and following steps are then carried out.

The stamp is first controlled to provide a partial bulge 170 as defined above. This is shown in the top image of FIG. 7.

In the iterative alignment method, this bulge is enlarged further to make a full bulge which contacts the substrate on the substrate carrier 120. This is shown in the middle image of FIG. 7.

The bulge is at the location of an alignment marker on the substrate or carrier, shown by the arrow 172.

A first alignment marker may be present on the stamp surface and a second alignment marker may be present on the substrate surface, and the relative positions can be determined using an optical alignment system. For this purpose, the carrier 120 and the stamp are partly optically transparent for allowing the alignment determination.

The first and second alignment markers may for example comprise gratings which invoke a Moiré pattern due to their overlap when illuminated with a light source and observed using an optical system. From these patterns the misalignment can be determined and quantified, in known manner, to determine grating overlap mismatch distances in the lateral directions, i.e. in the X and/or Y directions.

If there is an alignment error, the stamp is made to retreat to the partial bulge position, so that corrective relative movement can be applied between substrate and the stamp carrier. Thus, the process returns to the top image in FIG. 7.

Figure 7:
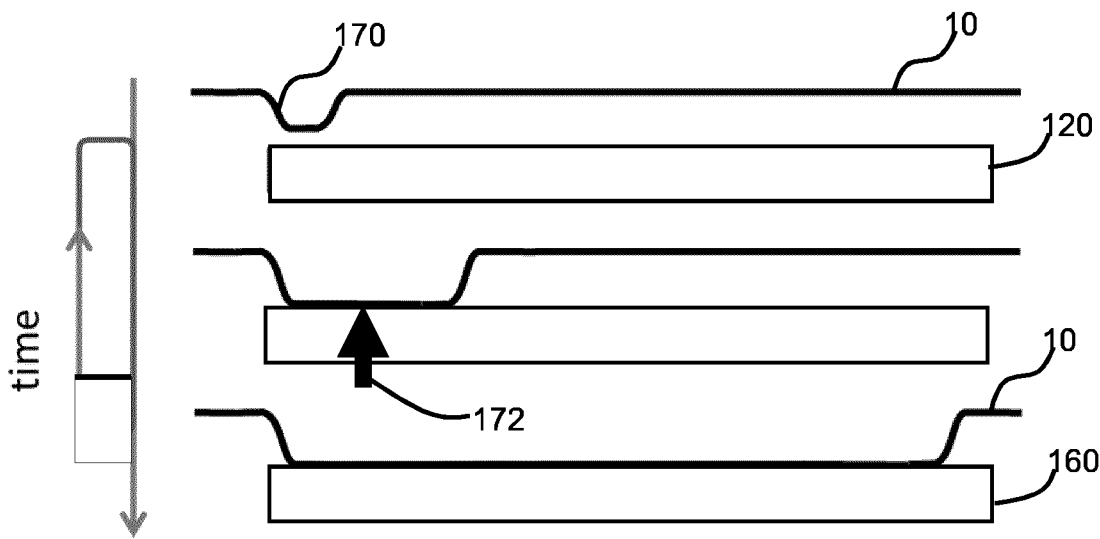
FIG. 7 shows a first example of imprinting method in accordance with an example of the invention.

When the alignment measurement indicates correct alignment, the process can proceed to full placement of the stamp 10 on the substrate, as shown in the bottom image in FIG. 7.

In the dynamic alignment method, the non-contact partial bulge is used for the alignment measurement.

Again, the process optionally starts with one or both of the two stamp relaxation processes explained with reference to FIGS. 5 and 6. The active substrate is positioned in place, and following steps are then carried out.

The stamp is first controlled to provide a partial bulge 170*a* as defined above. This is shown in the top image of FIG. 8.

The bulge size is increased by increasing the number of active pressure grooves and/or increasing the pressure applied under the grooves. The partial bulge advances towards the substrate to form a more advanced partial bulge 170*b* as shown in the second image in FIG. 8.

As the gap between the stamp 10 and substrate (or substrate carrier 120) gets smaller the substrate is aligned to the stamp as shown by arrows 172, for successive sizes of partial bulge.

Figure 8:
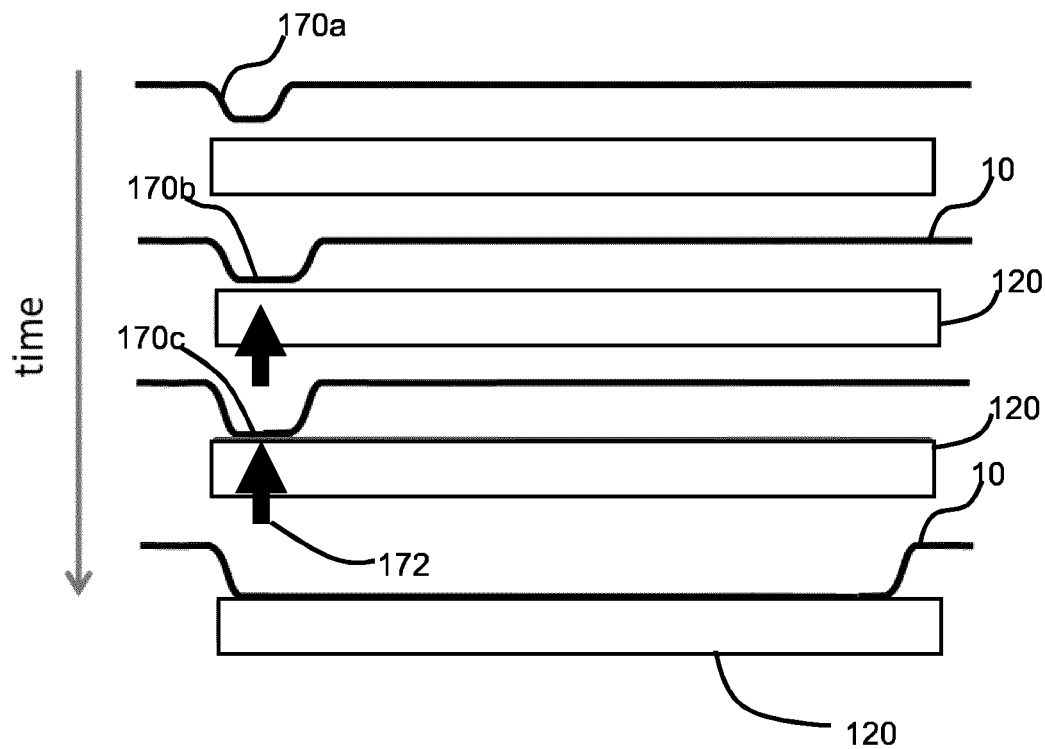
FIG. 8 shows a second example of imprinting method in accordance with an example of the invention.

When the error is below a threshold, contact is made with the imprint resist on the substrate and contact on the substrate is advance to the fully contacted state as shown in the bottom image in FIG. 8. In this manner a controlled approach to the substrate is made.

Figure 9:
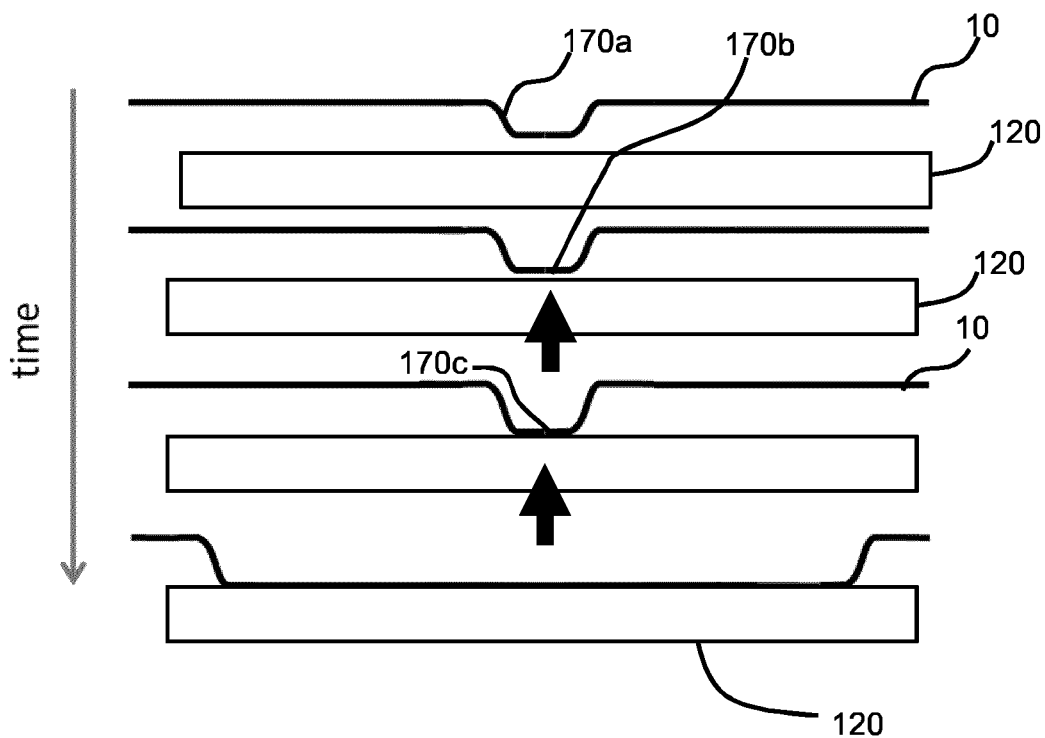
FIG. 9 shows a third example of imprinting method in accordance with an example of the invention.

FIG. 9 shows the same process, but shows that the bulge does not need to be at the edge of the stamp—it may be anywhere, for example in the center.

This dynamic alignment can be performed with the alignment markers free of resist (as previous methods) or with the markers covered with resist.

The gap between the stamp and the substrate varies for different measurements in the dynamic case. This gap will also influence the Moiré pattern as will any x-y position change. The effect of the gap height on the alignment result or interference patterns can be determined in advance. A further marker could also be used to track the z-axis distance during the approach of the stamp, which can then be used to accurately determine the x-y offsets.

If a resist layer is present through which optical measurements are made, it will reduce the optical contrast and the thickness will have also have to be taken into account when analyzing the optical patterns, as this thickness can also influence the optical alignment results, such as the position of Moiré fringes.

The required functionality is already enabled by SCIL applications, except that the individual grooves need to be addressed in a different order. Furthermore additional pressure control may be required in order to control the size and height of the bulge and thereby the distance between the stamp and substrate until contact is made.

At this point, it is noted that the embodiments of the imprinting apparatus 100 of the present invention are shown to have apertures 112 as stamp engaging elements of the flexible stamp 10 by way of non-limiting example only. It is for instance equally feasible to replace the apertures 112 by mechanical stamp engaging elements, e.g. plungers or the like, which mechanical stamp engaging elements may be individually controlled by the processing element 130, such that in a first configuration the mechanical stamp engaging elements pull a portion of the flexible stamp towards the first carrier 110, and in a second configuration the mechanical stamp engaging elements push a portion of the flexible stamp 10 against the substrate 20.

It will be immediately realized by the person skilled in the art that such mechanical stamp engaging elements may be controlled in an entirely analogous manner, e.g. by varying the rate at which these mechanical stamp engaging elements are switched between first and second configurations during the imprinting step and/or the rate at which these mechanical stamp engaging elements are switched between second and first configurations during the release step. It is furthermore noted for the avoidance of doubt that the flexible stamp 10 may be secured on such mechanical stamp engaging elements in any suitable manner, e.g. using clamping means, adhesive means, suction means, and so on. As such securing means are well-known per se, this will not be explained in further detail for the sake of brevity only.

A computer program product may be provided that comprises a computer-readable data carrier having stored thereon computer program code for implementing one or more embodiments of the method of the present invention. The product may be in the form of code stored on a (server based) data network so that the code can be downloaded from this network to an apparatus controller or other means for use of the code to execute the method. The computer program code typically is code that can be executed on the processing element 130 of the imprinting apparatus 100, and which causes the processing element 132 control the imprinting apparatus 100 in accordance with the one or more embodiments of this method. The imprinting apparatus 100 may include the computer program product. Any suitable computer-readable data carrier may be used; non-limiting examples of such computer-readable data carriers include a CD, DVD, Flash memory, an Internet-accessible data carrier such as a solid state or magnetic disk, which disk may be located in an Internet server, and so on.

In an embodiment, aspects of the computer program code may be derived from a design file specifying the imprinting pattern 12 of the flexible stamp 10, such as a GDSII file. In particular, such a file may be automatically evaluated to establish the feature variations in the imprinting pattern 12 and to derive the optimal imprinting process parameters such as the required rate variations in the imprinting step, imprinting direction, change in gap dimensions between imprinting and release steps, required rate variations in the release step, release direction and so on. These derived parameters may be included in the imprinting apparatus control program to be executed by the processing element 130.

The example above relate to imprinting. However, the same alignment approach can be used for aligning other layers, for example for bonding layers together or stacking layers. Stacking of layers to form devices is for example used in MEMS devices, and this invention can be used for a mechanical transfer of one layer onto another with accurate alignment. For example, two wafers (at least one of which is flexible) may be bonded together with accurate alignment. Alternatively, a polymer layer, which for example may include nanoparticles, may be applied to a substrate with accurate alignment.

The alignment measurements can be carried out in different ways. For example, alignment measurements can be carried out through a transparent carrier.

The alignment needs to be measured based on the position of the advanced bulge (or partial bulge) with respect to the substrate.

For this purpose, the substrate and the stamp can have corresponding alignment markers which face each other.

An alternative is to measure the alignment between a first pair of alignment markers on the substrate carrier and on the stamp at an edge region of the substrate carrier beyond the edge of the substrate. A second pair of alignment markers can then be provided on the substrate and on the substrate carrier. The substrate alignment markers can then be at the backside of the substrate. The backside alignment markers are used to measure the offset between the substrate and the substrate carrier (the "chuck"). The stamp is instead aligned to the substrate carrier (the "chuck") outside the wafer area, taking into account the offset of the substrate to substrate carrier.

Thus, the alignment markers on the stamp bulge may advance towards the location of an alignment marker which may be on the substrate or on the substrate carrier (if the substrate carrier and substrate relative position is then also known).

Figure 10:
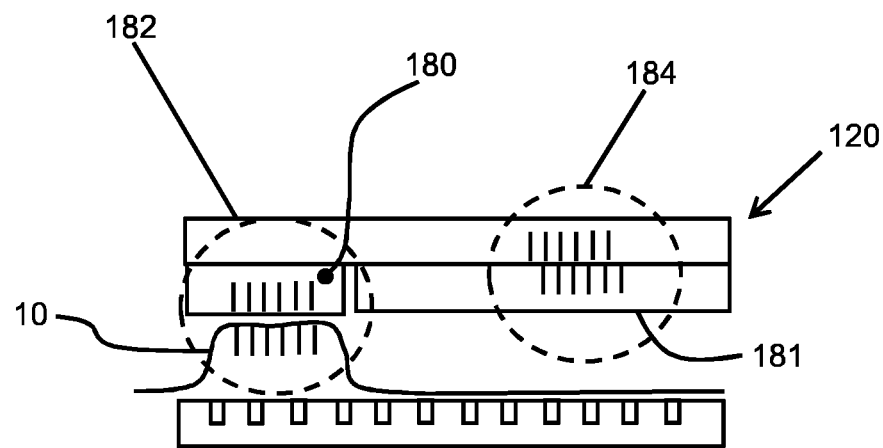
FIG. 10 shows another imprinting apparatus according to an embodiment of the present invention using a different alignment marker arrangement.

This approach is shown in FIG. 10. The substrate carrier (the second carrier) 120 has a portion 180 which is beyond the edge of the substrate 181. The first pair of alignment markers on the portion 180 of the substrate carrier and on the stamp are shown as 182. The second pair of alignment markers on the backside of the substrate and on the main part of the substrate carrier are shown as 184.

Note also that alignments may be measured by various techniques including capacitance measurement (for detecting a degree of overlap) and interferometry for determining edge positions. The overall alignment measurement may include such techniques in addition to alignment markers provided on the stamp. Thus, alternative position measurement may be used instead of the pair of markers 184.

In summary, a method of transferring a flexible layer to a substrate makes use of a partial bulge in the flexible layer, which does not make contact with the substrate. The partial bulge advances to the location of an alignment marker on the substrate. When alignment adjustments are needed, they are made with the partial bulge in place so that more reproducible positioning is possible when fully advancing the flexible layer against the substrate.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. The invention can be implemented by means of hardware comprising several distinct elements. In the device claim enumerating several means, several of these means can be embodied by one and the same item of hardware. The mere fact that certain measures are recited in mutually different dependent claims does not indicate that a combination of these measures cannot be used to advantage.

The invention claimed is:

1. A method for mechanically contacting a flexible stamp to a substrate, comprising:
   forming at least a partial stamp bulge, the stamp bulge having a stamp bulge portion;
   positioning the flexible stamp such that the stamp bulge portion is at a first non-zero distance to the substrate without contact with the substrate and closer to the substrate than a portion of the flexible stamp outside the partial stamp bulge portion;
   measuring a lateral alignment between the stamp bulge portion and the substrate, wherein the lateral alignment is determined by obtaining a relative position between a first marker on a surface of a flexible stamp feature located in the stamp bulge portion and a second marker on a surface of a substrate feature located on the substrate;
   determining whether adjustment of the lateral alignment is needed, while the stamp bulge portion is kept in place;
   if adjustment of the lateral alignment is needed, making a lateral adjustment by lateral translation of at least the stamp bulge portion relative to the substrate, while maintaining the partial stamp bulge portion in place and if adjustment of the lateral alignment is not needed or after the lateral adjustment has been made, advancing the stamp bulge portion towards the substrate to form a full stamp bulge portion in contact with the substrate.

2. The method as claimed in claim 1, further comprising: forming the partial stamp bulge portion at the first non-zero distance, wherein the distance between the portion of the flexible stamp outside the stamp bulge portion and the substrate defines a gap distance; and wherein a height of the partial stamp bulge portion is at least 20% of the gap distance.

3. The method as claimed in claim 1, further comprising growing the partial stamp bulge portion.

4. The method as claimed in claim 1, wherein the flexible stamp feature located in the stamp bulge portion or the substrate feature located in the substrate are alignment markers.

5. The method as claimed in claim 1, further comprising comparing the measured lateral alignment with a predetermined minimum lateral alignment and determining that adjustment of the lateral alignment is needed when the measured lateral alignment is greater than the predetermined minimum lateral alignment.

6. The method as claimed in claim 1, wherein the flexible stamp comprises a stamping area, and further comprising:
moving the at least partial stamp bulge across the flexible stamp such that the at least the entire stamping area is part of the at least partial stamp bulge.

7. The method as claimed in claim 6, wherein the at least partial stamp bulge is a full partial stamp bulge of which the stamp bulge portion is in mechanical contact with a dummy substrate, further comprising:
after the moving the at least partial stamp bulge across the flexible stamp, retracting the full partial stamp bulge from the dummy substrate to form the at least partial stamp bulge; and
replacing the dummy substrate with the substrate.

8. An imprinting method, comprising:
forming at least a partial stamp bulge, the partial stamp bugle having a stamp bulge portion;
positioning the flexible stamp such that the stamp bulge portion is a partial stamp bulge portion at a first non-zero distance to the substrate without contact with the substrate and closer to the substrate than a portion of the flexible stamp outside the partial stamp bulge portion, or a full stamp bulge portion in contact with the substrate;
measuring a lateral alignment between the stamp bulge portion and the substrate, wherein the lateral alignment is determined by obtaining a relative position between a first marker on a surface of a flexible stamp feature located in the stamp bulge portion and a second marker on a surface of a substrate feature located on the substrate;
determining whether adjustment of the lateral alignment is needed, while the stamp bulge portion is kept in place;
if adjustment of the lateral alignment is needed, making a lateral adjustment by lateral translation of at least the stamp bulge portion relative to the substrate, while maintaining the partial stamp bulge portion in place; and
if adjustment of the lateral alignment is not needed or after the lateral adjustment has been made, advancing the stamp bulge portion towards the substrate to form a full stamp bulge portion in contact with the substrate, wherein the flexible stamp comprises a stamping area that includes a relief pattern to be transferred to an imprintable surface of the substrate.

9. An apparatus, comprising: controller circuitry to;
form an at least partial stamp bulge, the stamp bulge having a stamp bulge portion;
position the flexible stamp such that the stamp bulge portion is at a first non-zero distance to the substrate without contact with the substrate and closer to the substrate than a portion of the flexible stamp outside a partial stamp bulge portion;
measure a lateral alignment between the stamp bulge portion and the substrate, wherein the lateral alignment is determined by obtaining a relative position between a first marker on a surface of a flexible stamp feature located in the stamp bulge portion and a second marker on a surface of a substrate feature located on the substrate;
determine whether adjustment of the lateral alignment is needed, while the stamp bulge portion is kept in place;
if adjustment of the lateral alignment is needed, making a lateral adjustment by lateral translation of at least the stamp bulge portion relative to the substrate while maintaining the partial stamp bulge portion in place; and
if adjustment of the lateral alignment is not needed or after the lateral adjustment has been made, advancing the stamp bulge portion towards the substrate to form a full stamp bulge portion in contact with the; and
a stamp carrier controlled by the controller circuitry, the stamp carrier comprising a plurality of engaging elements disposed across the area of the stamp carrier, each engaging element being individually switchable by the controller circuitry between a first configuration in which a flexible stamp is pulled towards the stamp carrier and a second configuration in which the flexible stamp is pushed away from the stamp carrier; and
a substrate carrier for carrying the substrate or a dummy substrate.

10. The apparatus as claimed in claim 9, wherein each engaging element comprises an aperture, each aperture comprising a valve for switching the aperture between an under-pressure channel in a first configuration and an over-pressure channel in a second configuration, the valve being controlled by the controller.

11. A non-transitory computer-readable medium having one or more executable instructions stored thereon, which, when executed by a processor, cause the processor to perform a method for mechanically contacting a flexible stamp to a substrate, the method comprising:
forming at least a partial stamp bulge, the partial stamp bulge having a stamp bulge portion;
positioning the flexible stamp such that the stamp bulge portion is either a partial stamp bulge portion at a first non-zero distance to the substrate without contact with the substrate and closer to the substrate than a portion of the flexible stamp outside the partial stamp bulge portion or a full stamp bulge portion in contact with the substrate;
measuring a lateral alignment between the stamp bulge portion and the substrate, wherein the lateral alignment is determined by obtaining a relative position between a first marker on a surface of a flexible stamp feature located in the stamp bulge portion and a second marker on a surface of a substrate feature located on the substrate;

determining whether adjustment of the lateral alignment is needed, while the stamp bulge portion is kept in place;

if adjustment of the lateral alignment is needed, making a lateral adjustment by lateral translation of at least the stamp bulge portion relative to the substrate, either while maintaining the partial stamp bulge portion in place or after retracting the full stamp bulge portion to a partial stamp bulge portion; and if adjustment of the lateral alignment is not needed or after the lateral adjustment has been made, advancing the stamp bulge portion towards the substrate to form a full stamp bulge portion in contact with the substrate if there is a partial stamp bulge portion in place.

* * * * *